United States Patent [19]
Akaogi et al.

[11] Patent Number: 5,640,123
[45] Date of Patent: Jun. 17, 1997

[54] SUBSTRATE VOLTAGE CONTROL CIRCUIT FOR A FLASH MEMORY

[75] Inventors: Takao Akaogi; Yasushi Kasa, both of Kawasaki, Japan

[73] Assignee: Fujitsu Limited, Kanagawa, Japan

[21] Appl. No.: 449,001

[22] Filed: May 24, 1995

Related U.S. Application Data

[62] Division of Ser. No. 98,406, Aug. 6, 1993, abandoned.

[30] Foreign Application Priority Data

| Dec. 9, 1991 | [JP] | Japan | 3-324701 |
| Dec. 27, 1991 | [JP] | Japan | 3-346571 |
| Jan. 14, 1992 | [JP] | Japan | 4-4678 |
| Mar. 19, 1992 | [JP] | Japan | 4-64143 |
| Jun. 5, 1992 | [JP] | Japan | 4-145300 |
| Jun. 15, 1992 | [JP] | Japan | 4-154958 |
| Sep. 25, 1992 | [JP] | Japan | 4-256594 |
| Nov. 10, 1992 | [JP] | Japan | 4-299987 |

[51] Int. Cl.$^6$ ................................. H03K 3/01
[52] U.S. Cl. .................. 327/534; 327/374; 327/537; 327/535
[58] Field of Search .................. 327/535, 536, 327/537, 589, 434, 374, 534

[56] References Cited

U.S. PATENT DOCUMENTS

| 4,392,066 | 7/1983 | Hirao | 327/535 |
| 4,700,125 | 10/1987 | Takata et al. | 327/537 |
| 5,422,590 | 6/1995 | Coffman et al. | 327/536 |

FOREIGN PATENT DOCUMENTS

| 49-126249 | 12/1974 | Japan . |
| 50-140255 | 11/1975 | Japan . |
| 60-211699 | 10/1985 | Japan . |
| 60-229300 | 11/1985 | Japan . |
| 61-186019 | 8/1986 | Japan . |
| 1-273357 | 11/1989 | Japan . |
| 2-71499 | 3/1990 | Japan . |
| 3-203097 | 9/1991 | Japan . |

*Primary Examiner*—Timothy P. Callahan
*Assistant Examiner*—Jung Ho Kim
*Attorney, Agent, or Firm*—Nikaido Marmelstein Murray & Oram LLP

[57] ABSTRACT

A substrate voltage control circuit is used to apply bias voltage to a substrate or a well of a semiconductor memory such as a flash memory. The substrate voltage control circuits do not use any depletion type transistors. Therefore, the area occupied by the transistors for the circuit is small.

6 Claims, 17 Drawing Sheets

FOR WRITING

FOR READING

FOR ERASING
(POSITIVE-VOLTAGE
APPLICATION)

FOR ERASING
(NEGATIVE-VOLTAGE
APPLICATION)

SUBSTRATE VOLTAGE CONTROL CIRCUIT FOR A FLASH MEMORY

This is a division of application Ser. No. 08/098,406 filed Aug. 6, 1993 abandoned.

TECHNICAL FIELD

The present invention relates to a so-called flash memory or a nonvolatile semiconductor memory from which existent information can be electrically erased concurrently or block by block. In particular, this invention is concerned with improvements in erasing a flash memory and improvements in the associated circuitry.

In recent years, a variety of semiconductor memories such as an electrically erasable programmable read only memory (EEPROM), which can be rewritten by electrically erasing data stored therein, have been developed in the field of nonvolatile memories.

The semiconductor memories are nonvolatile memories which are made rewritable by electrically erasing specified data previously written therein.

As for this kind of nonvolatile memory, in consideration of the use as a substitute for a magnetic storage or the like, efforts have been made to increase the capacity and decrease the cost. For use in a portable information processing terminal or the like, however, it is required to lower the voltage requirements.

Known semiconductor memories, which are nonvolatile memories that are made rewritable by erasing specified data previously written therein, include an erasable programmable read only memory (EPROM) and the EEPROM.

The EPROM has the advantage of a small cell size. However, data erasing is a nuisance because ultraviolet light must be used to erase data. As for the EEPROM, data erasing is easy to do because data can be erased electrically. However, the cell size in the EEPROM is larger than that in the EPROM, which makes it difficult to increase the capacity of an EEPROM.

As a semiconductor memory having the advantages of the foregoing memories, for example, what is referred to as a flash memory has been developed.

The term "flash memory" will be adopted in the succeeding description.

BACKGROUND ART

The nonvolatile semiconductor memory has an overall configuration, for example, as that shown in FIG. 1. In FIG. 1, N cell blocks $11_1$ to $11_N$ (for example, eight blocks) each having multiple transistor cells are arranged in a row. The cell blocks $11_1$ to $11_N$ are provided with bit line select circuits $12_1$ to $12_N$ and sense amplifiers/sense buffers $13_1$ to $13_N$ respectively.

A row address signal is supplied from a row address buffer 14 to each of the cell blocks $11_1$ to $11_N$ via a row decoder 15. A column address signal is supplied from a column address buffer 16 to each of the bit line select circuits $12_1$ to $12_N$ via a column address decoder 17. A voltage $V_S$ sent from a source power supply circuit 18 is applied to each of source electrodes of the transistor cells of the cell blocks $11_1$ to $11_N$.

FIG. 2 shows the cell block 11, one of the cells blocks in the aforesaid nonvolatile semiconductor memory, and its peripheral circuitry. In FIG. 2, components identical to those in FIG. 1 bear the same reference numerals, of which a description will be omitted. In FIG. 2, the bit line select circuit 12 comprises n-channel MOS field-effect transistors Q1 to Qn. Column address signals Y1 to Yn are fed from the column decoder 17 to the gates of the transistors Q1 to Qn.

The cell block 11 comprises a total of n by n field-effect transistors Q11 to Qnn having floating gates and control gates. The gates of n transistors Qi1 to Qin (where, i=1, 2, etc., and n) arranged in tandem are provided with row address signals Xi sent from the row decoder 15 via word lines.

The drains of the n transistors Q1i to Qni arranged in tandem are connected to the drains of the transistors Qi in the bit line select circuit 12 via bit lines. Voltage from the source power circuit 18 is applied to each of the sources of the transistors Q11 to Qnn. A cell amplifier 13a and a write buffer 13b are connected to each of the sources of the transistors Q1 to Qn.

In the foregoing semiconductor memory, when row addresses Xi and column addresses Yi are selected for writing, data read from the write buffer 13 are written in the transistors Qij of the cell blocks $11_1$ to $11_N$. Writing is performed simultaneously on one bit per each of the cell blocks $11_1$ to $11_N$ or a total of N bits designated with the row addresses and column addresses. Data erasing is performed concurrently on all transistors in the cell blocks $11_1$ to $11_N$.

In a flash memory, information is retained depending on the presence or absence of a charge in a memory cell. FIG. 3 shows an example of a structure of a memory cell. As shown in FIG. 3, a gate has a two-layered structure consisting of a control gate (CG) 25 and a floating gate (FG) 24. The control gate 25 is connected to a word line WLi and a drain (D) 23 is connected to a bit line BLi. Reference numeral 26 denotes a tunneling oxide film.

The flash memory is broadly divided into two types of what are referred to as NOR and NAND. These types differ from each other in a method of writing, reading, or erasing information into or from a memory cell. Taking the NOR type flash memory as an example, writing, reading, or erasing information into or from a memory cell will be described below.

When information is to be written in a memory cell having the aforesaid structure, as shown in FIG. 4, the word line WLi is set to Vpp (approx. 12 V), the bit line BLi is set to approx. 6 V, and the source S is set to 0 V. High voltage is then applied to the control gate CG and drain D. Current then flows into the memory cell. Part of the electrons flowing through the memory cell are accelerated due to the high electric field in the vicinity of the drain D, gain energy, and then goes beyond the energy barrier of an insulating film of the floating gate. The electrons are finally injected into the floating gate FG. The floating gate FG is not electrically coupled with other circuits, so it therefore can retain charges on a semi-permanent basis.

When information is to be read from a memory cell, as shown in FIG. 5, the word line WLi is set to Vcc (about 5 V), the bit line BLi is set to about 1 V, and the source S is set to 0 V. The memory cell is then selected by specifying the word line WLi and bit line BLi. The threshold value of the cell transistor varies depending on the charges retained in the floating gate FG. Current flowing through the selected memory cell varies depending on the information stored therein. The information therefore can be read out by detecting and amplifying the current.

The voltage levels of the control gate CG, drain D, source S, and substrate PS in the aforesaid operative states are set to the values listed in Table 1.

TABLE 1

| | Voltages in modes in a prior art | | | |
|---|---|---|---|---|
| | CG | D | S | PS |
| Reading | Vcc | to 1 V | 0 V | 0 V |
| Writing | Vpp | to 6 V | 0 V | 0 V |
| Erasing | 0 V | Float | Vpp | 0 V |

When information is to be erased from a memory cell, as shown in FIG. 6, the word line WLi is set to about 0 V and the bit line BLi is opened. In this state, the drain D is opened, about 0 volt is applied to the control gate CG, and a high voltage of about 12 volts is applied to the source S.

Since a high voltage is applied to the source S, deep diffusion is required in order to increase the resistivity of the diffused layer in the source. This hinders reduction in cell area.

For divided erasing, it is required that the Vss line in the source must partly have a different voltage. This leads to disconnection or an increased number of drive circuits. Eventually, chip size increases.

A solution to the above problem is to apply a negative voltage to the word line WLi. To be more specific, as shown in FIG. 7, a negative voltage (about −10 V) is applied to the control gate CG and Vcc (about 5 V) is applied to the source S. The drain D is opened. Erasing is then executed.

In this case, since a low voltage is applied to the source S, the resistivity of the source need not be intensified. This contributes to reduction in cell size. Partial erasing is enabled by selectively applying negative voltage to the control gates CG.

The aforesaid erasing method is a source erasing method in which charges in the floating gate FG are routed to the source. A channel erasing method is also available, wherein charges in the floating gate are routed to a channel; that is, a substrate. Even in this method, negative voltage is applied to the control gate. The channel erasing method is sometimes employed for the aforesaid NAND-type flash memory.

FIGS. 8 to 11 show the states of a memory cell with voltage applied according to various erasing methods. In FIGS. 8 to 11, the memory cell is an n-channel transistor.

FIG. 8 shows a state in which positive voltage is applied according to a channel erasing method. The drain D and source S are opened, and the control gate CG is set to 0 V. The high voltage Vpp is applied to the P well equivalent to a channel. In channel erasing, a triple-well structure shown in FIG. 8 is adopted because positive bias is applied to the channel.

FIG. 9 shows a state in which a positive voltage is applied according to the source erasing method. The drain D is opened, and then the control gate CG is set to 0 V. The high voltage Vpp is applied to the source S. The substrate is opened or set to 0 V.

FIG. 10 shows a state in which a negative voltage is applied according to the channel erasing method. The drain D and source S are opened, and the control gate CG is set to a negative voltage $V_{BB}$. A positive voltage Vcc is applied to the p well equivalent to a channel. $V_{BB}$–Vcc is applied between the control gate CG and channel.

FIG. 11 shows a state in which negative voltage is applied according to the source erasing method. The drain D is opened, and then the control gate CG is set to the negative voltage $V_{BB}$. The source S is set to the positive voltage Vcc.

The resistivity of a junction in a source region can be improved by applying negative voltage to a control gate during erasing. This has the advantage of enabling reduction of a cell area. It is, however, a big problem how to realize application of negative voltage to the control gate.

It is, for example, conceivable to apply negative voltage from a row decoder to word lines. The voltage to be applied to a word line is changed depending on whether the word line is selected or not. In a flash memory, the voltage to be applied to a word line must be varied depending on whether the read mode or write mode is selected. When the row decoder is used to apply a negative voltage, the voltage to be applied to a word line must be changed to a negative voltage. A word line selected in the read or write mode has a higher voltage than other unselected word lines. For erasing, however, the selected word line must have a lower voltage than the unselected word lines. The level of applied voltage must therefore be reversed depending on the logic of selected or unselected word lines. This results in complex circuitry, making downsizing in possible.

A flash memory includes an internal power switching circuit for switching supply voltages depending on a mode. A conventional internal power switching circuit has a simple circuitry but is likely to cause a latch-up phenomenon. The switching speed is decreased in order to avoid the latch-up phenomenon. This contradicts efforts to speeding up processing.

Furthermore, for negative voltage erasing, bias voltage must be applied to a substrate or part of a well. A conventional substrate bias circuit is realized with a p-channel depletion-type transistor. The manufacturing process is complex and downsizing is hard to do.

DISCLOSURE OF THE INVENTION

The present invention attempts to solve the aforesaid problems, and has the following objects:

To realize a substrate (well) voltage control circuit that consumes limited power and can be downsized.

The present invention is a substrate (well) voltage control circuit for use in a flash memory or the like. For attaining the object, the substrate voltage control circuit comprises a negative voltage source for outputting a negative voltage to a power line connected to a component whose voltage is to be controlled, a first n-channel transistor whose substrate (well) and source are connected to the power line and whose drain is connected to a ground power supply, a second n-channel transistor whose substrate (well) and source are connected to the power line and whose drain is connected to the gate of the first n-channel transistor, a first switch installed between the gate of the first n-channel transistor and a positive power supply, a second switch for use in selecting whether the gate of the second n-channel transistor is to be connected to the positive power supply or ground power supply, or opened, and a capacitative element connected between the gate and source of the second n-channel transistor. When negative voltage is not applied, the negative voltage source is put into a non-output state, the first switch is made, and the second switch is connected to the ground power supply. When negative voltage is to be applied, the first switch is opened and the second switch is connected to the positive power supply at the same time. Thereafter, the second switch is opened and the negative voltage source is put into an output state.

In the substrate (well) voltage control circuit based on the present invention, when negative voltage is applied, the gate-source voltage of the second n-channel transistor is held at a specified value owing to the charges retained in the capacitative element before switching is done. The second n-channel transistor therefore remains in the on state. The gate of the first n-channel transistor therefore assumes a negative voltage. The first n-channel transistor is then turned off. The power line is then disconnected from the ground power supply. A large voltage will not be applied between the gate and source of the second n-channel transistor, which obviates the need of improving resistivity, and downsizing becomes possible.

BRIEF DESCRIPTION OF THE DRAWINGS

FIG. 4 shows the conditions for writing; FIG. 5 shows the conditions for reading; FIG. 6 shows the conditions for erasing; FIG. 7 shows the conditions for erasing based on negative-voltage application;

BEST MODE FOR CARRYING OUT THE INVENTION

In a semiconductor memory such as a flash memory, bias voltage is applied to a substrate or well. The present invention relates to a substrate (well) voltage control circuit.

When a row decoder is used to apply negative voltage, the substrate or well of a drive unit is biased with negative voltage in order to prevent forward-bias current from flowing between a diffused layer and the substrate or well. However, during writing or reading, the substrate or well is set to a supply voltage Vss because negative voltage is not used.

Figure 1:
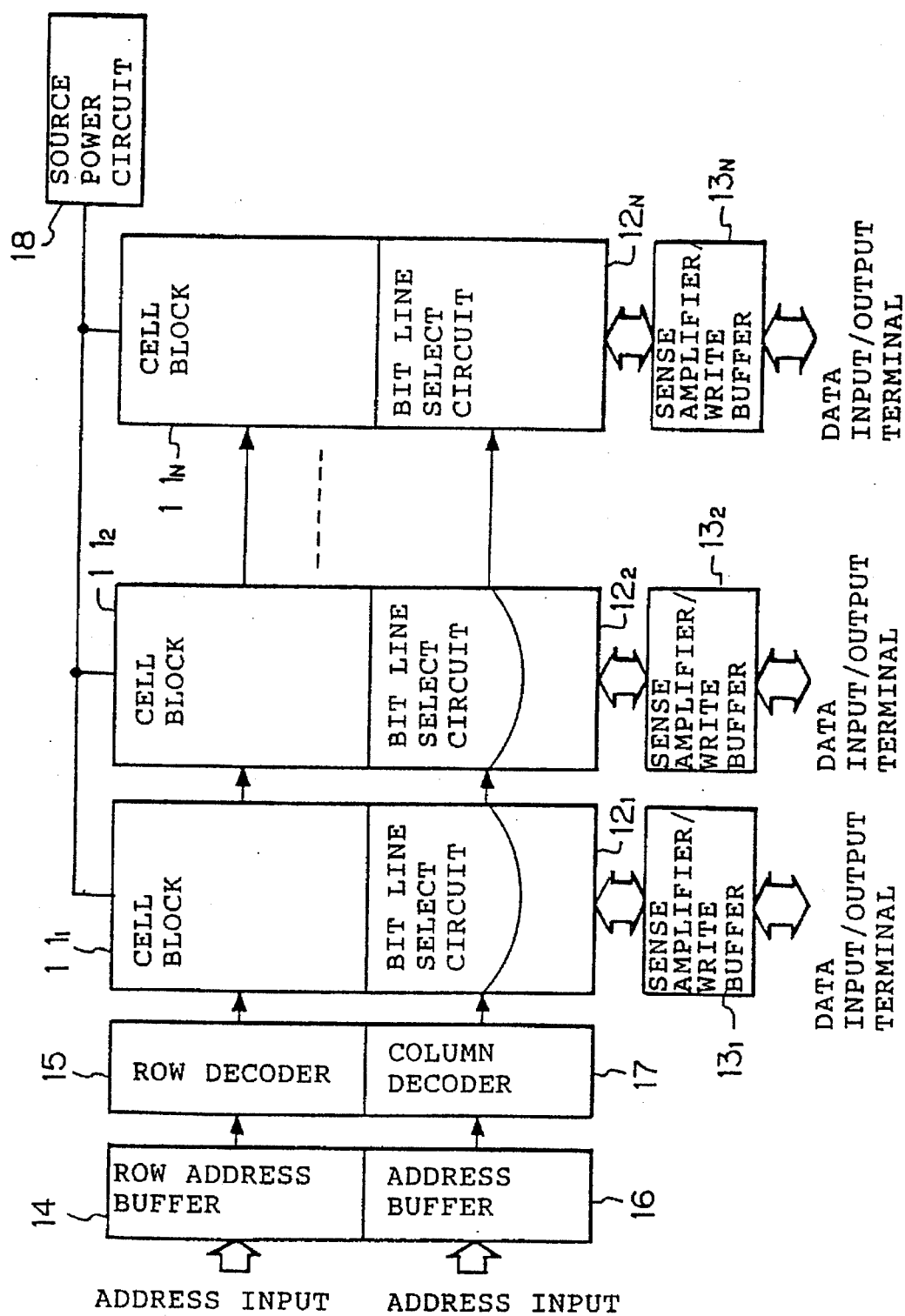
FIG. 1 shows an overall configuration of a flash memory in which the present invention is implemented.
Figure 2:
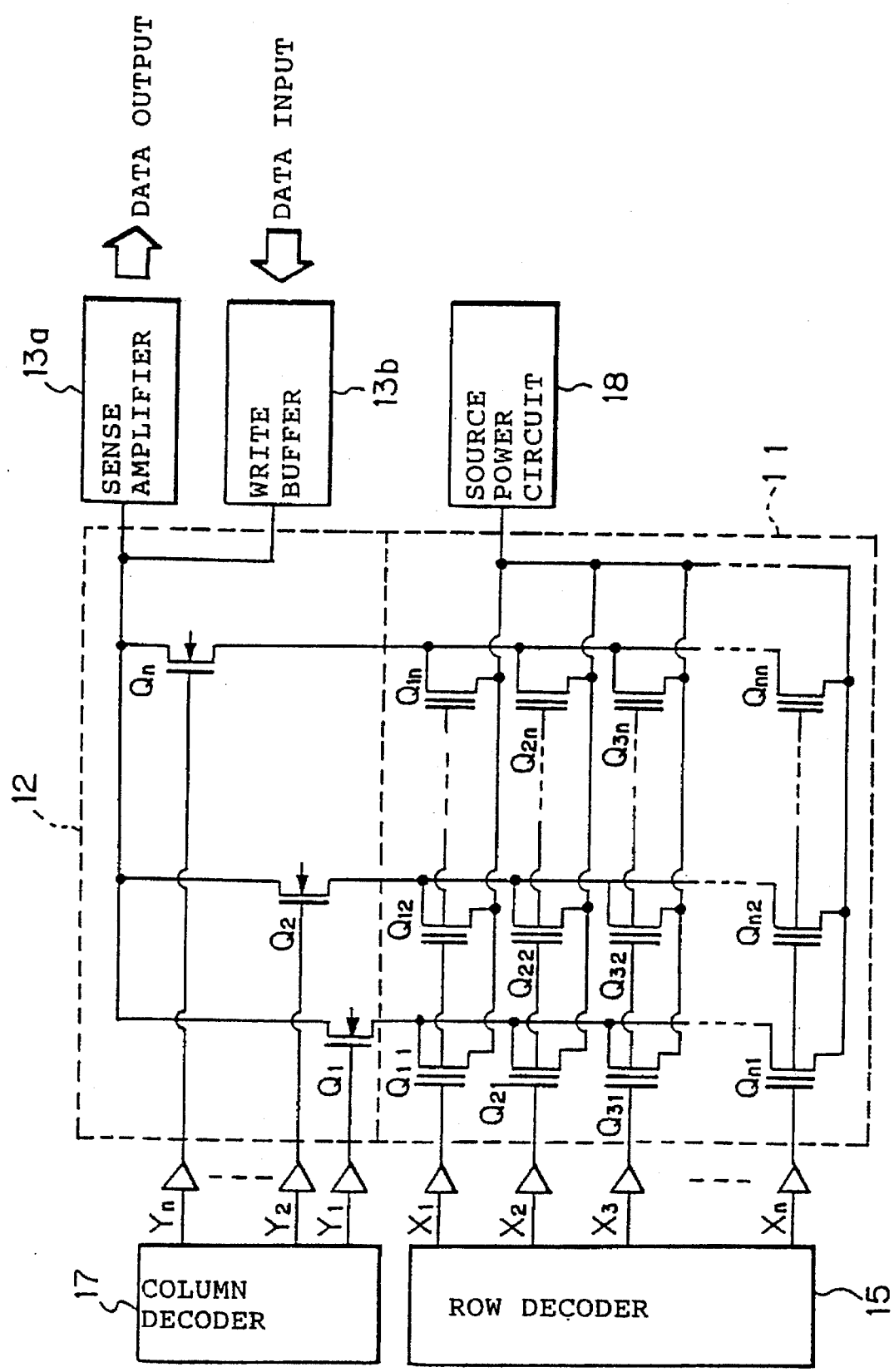
FIG. 2 is a circuit diagram showing a major section of FIG. 1.
Figure 3:
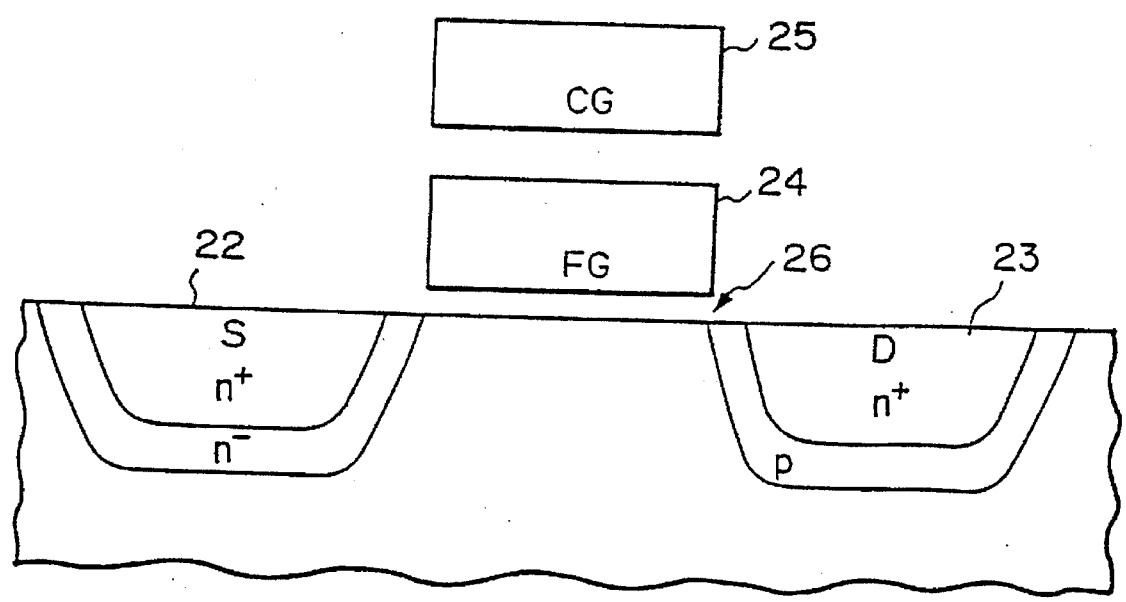
FIG. 3 shows a structure of a memory cell.
Figure 4:
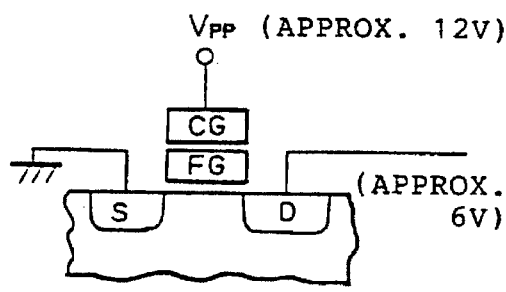
FIGS. 4 to 7 are explanatory diagrams for methods of reading, writing, and erasing a flash memory.
Figure 5:
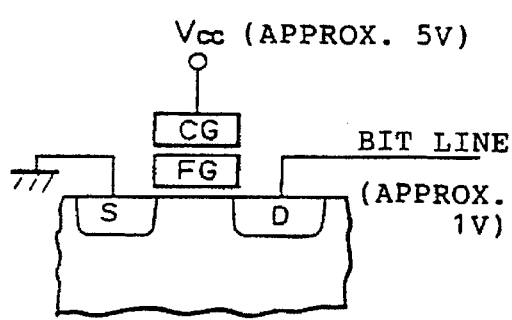
Figure 6:
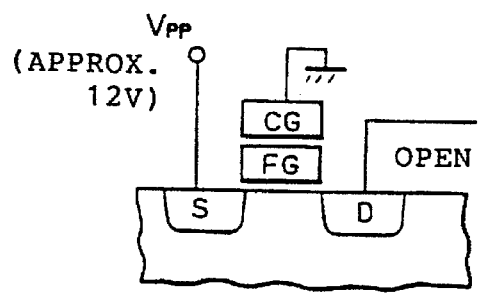
Figure 7:
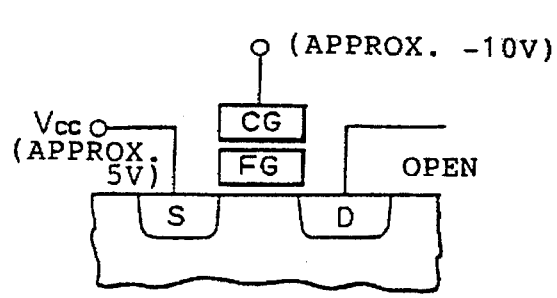
Figure 8:
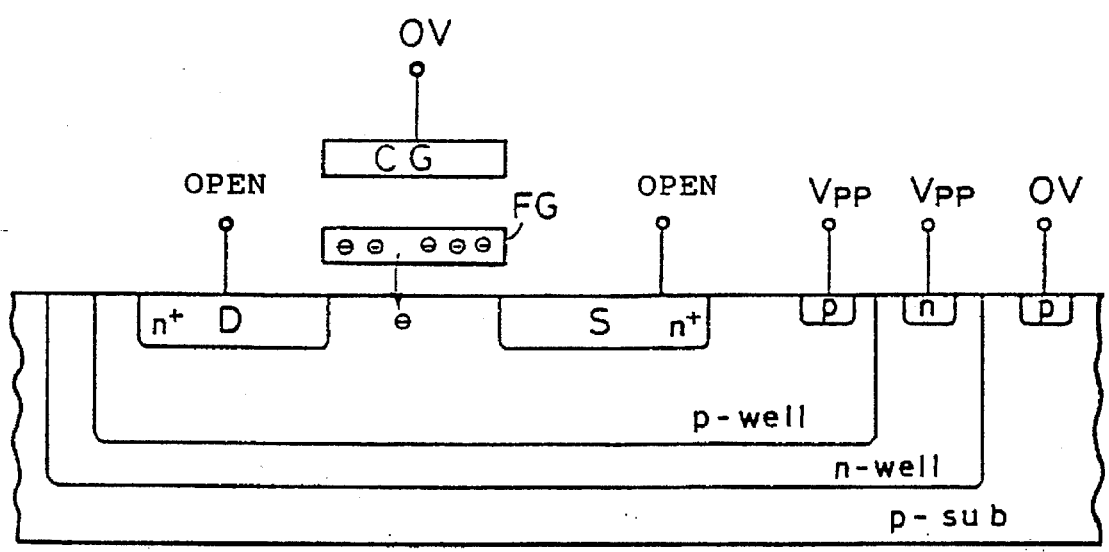
FIG. 8 is an explanatory diagram for channel erasing based on high-voltage application.
Figure 9:
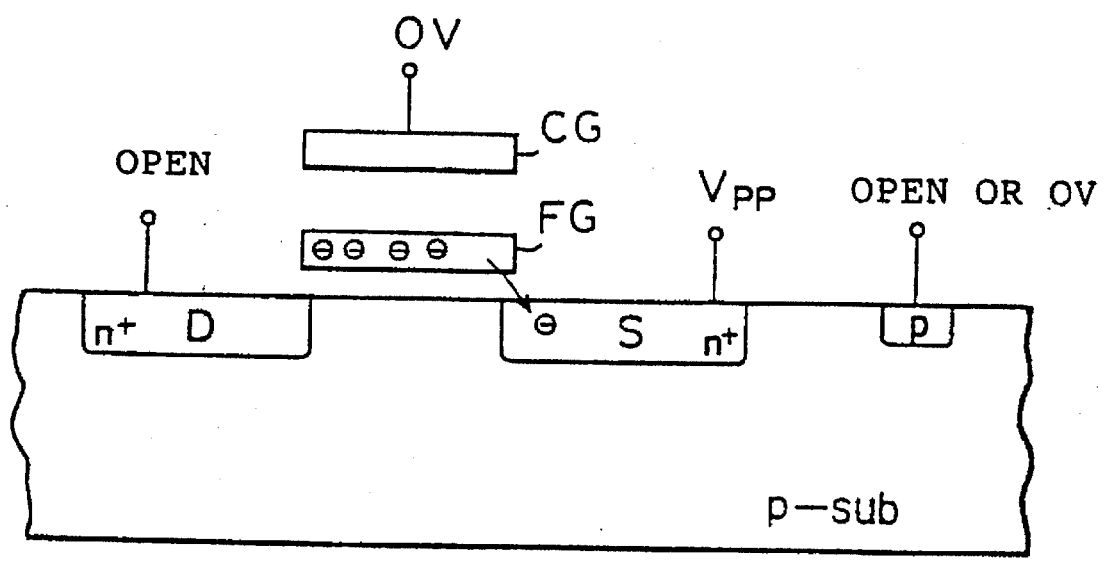
FIG. 9 is an explanatory diagram for source erasing based on high-voltage application.
Figure 10:
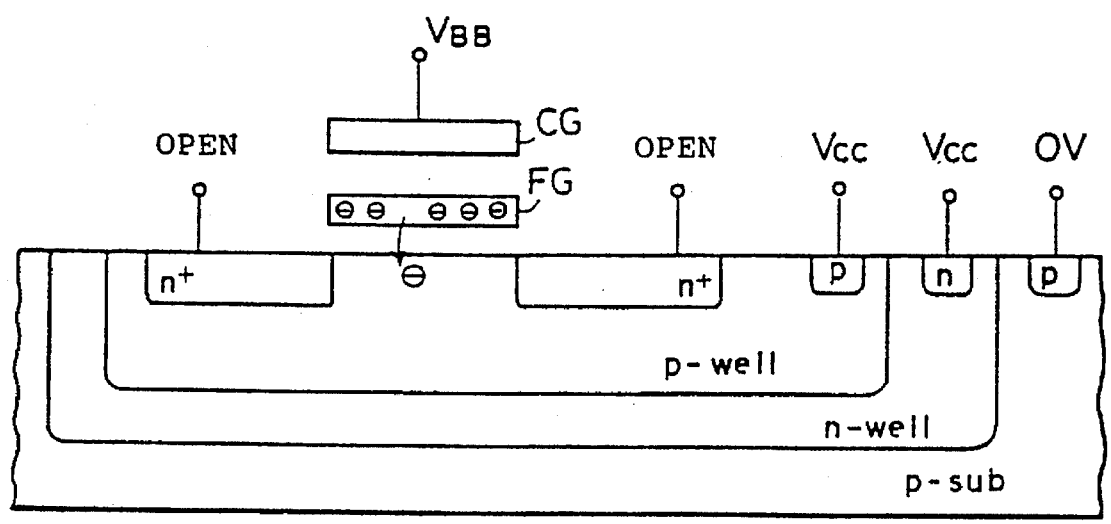
FIG. 10 is an explanatory diagram for channel erasing based on negative-voltage application.
Figure 11:
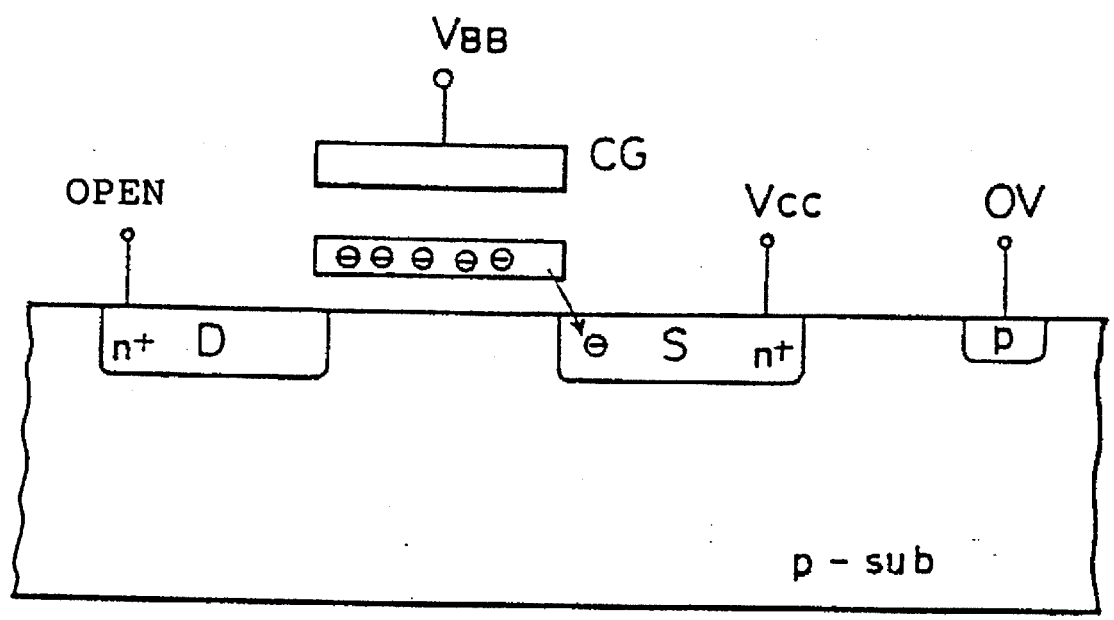
FIG. 11 is an explanatory diagram for source erasing based on negative-voltage application.
Figure 12:
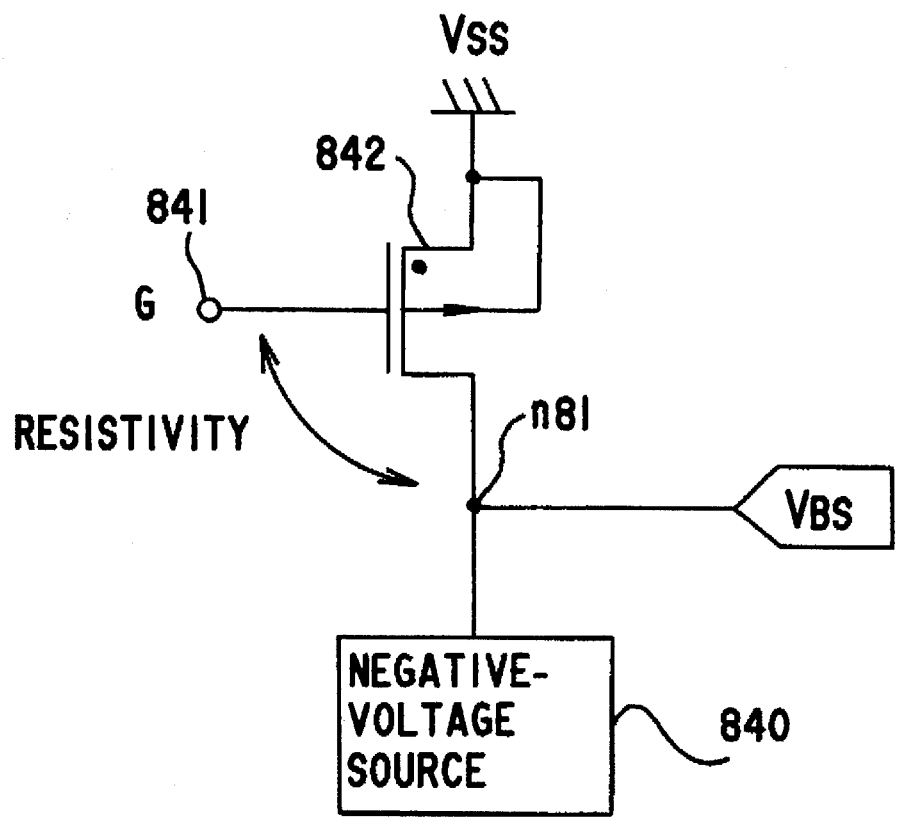
FIG. 12 shows an example of a conventional substrate (well) voltage control circuit.

A circuit shown in FIG. 12 has been used as a control circuit for the foregoing substrate (well) voltage in the past. In the circuit shown in FIG. 12, $V_{BS}$ denotes a substrate (well) voltage line. A p-channel depletion-type transistor 842 is employed to switch the voltage to be applied to the substrate (well) voltage line $V_{BS}$ from a negative voltage $V_{BB}$ provided by a negative voltage source 840 to a zero (ground) voltage Vss. When the gate voltage of the transistor 842 is switched between the normal supply voltage Vss and Vcc, voltages to be applied to the substrate voltage line Vss are changed. When the zero voltage Vss is placed on the substrate power line $V_{BS}$, the negative voltage source 840 becomes inoperative and does not output the negative voltage $V_{BB}$.

In the circuit shown in FIG. 12, the p-channel depletion-type transistor 842 is used to switch supply voltages. When the threshold voltage Vth of the transistor 842 is set to an intermediate value between the zero voltage Vss and positive voltage Vcc, if a control signal G is high (Vcc, the transistor 842 is off. If the control signal is low (Vss), the transistor 842 is on. Table 1 shows a truth table for the circuit in FIG. 12.

TABLE 1

| Truth table for the circuit in FIG. 12 | | | |
|---|---|---|---|
| G | Transistor 842 | $V_{BS}$ | Negative-voltage generator |
| Vss | On | Vss | No output |
| Vcc | Off | $V_{BB}$ | Output |

The control circuit for a substrate (well) voltage shown in FIG. 12 has the advantage of a simple circuitry but poses the following problems:

(1) Another process is needed to manufacture a p-channel depletion region, resulting in complex processes;

(2) The threshold voltage Vth of a p-channel depletion-type transistor must be controlled precisely, resulting in demanding process management;

(3) A p-channel transistor is larger in area than an n-channel transistor, resulting in a large-scale circuit; and (4) When the negative voltage $V_{BB}$ is applied to the substrate (well) power line $V_{BS}$, the positive voltage Vcc is applied to the gate of the transistor 842. A difference between the positive voltage Vcc and negative voltage $V_{BB}$ is therefore applied between the gate and drain of the transistor 842. This increases an applied voltage, making it necessary to intensify the resistivity between the gate and drain of the transistor 842. To intensify the resistivity, the gate oxide film must be made thicker. This results in an increased area.

Figure 13:
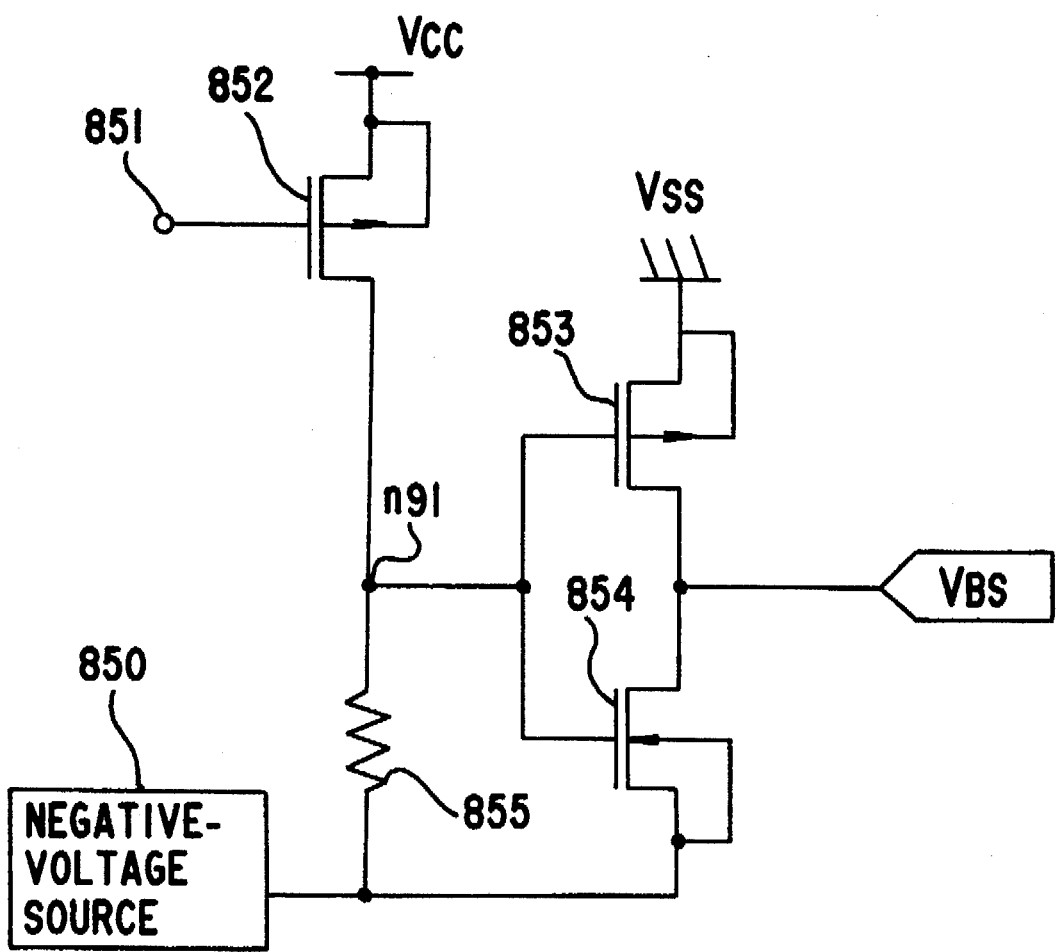
FIG. 13 shows other example of a conventional substrate (well) voltage control circuit.

A circuit shown in FIG. 13 has been employed as a substrate (well) voltage control circuit using no p-channel depletion-type transistor in the past. Table 2 is a truth table for the circuit in FIG. 13.

TABLE 2

Truth table for the circuit in FIG. 13

| G1 | Node 91 | Transistor 852 | Transistor 853 | Transistor 854 | $V_{BS}$ |
|---|---|---|---|---|---|
| Vcc | $V_{BB}$ | Off | On | Off | Vss |
| Vss | Vcc | On | Off | On | $V_{BB}$ |

The circuit shown in FIG. 13 uses enhancement transistors alone. Another process is therefore unnecessary. When the substrate (well) power line $V_{BS}$ is set to the zero voltage Vss, the voltage at a point n91 must be held negative. To achieve this purpose, the negative voltage source 850 must output negative voltage all the time. The negative voltage source 840 must therefore be operative all the time. This results in increased power consumption. The above problem (3) of a large-scale circuit and problem (4) that a high resistivity is needed are not resolved.

As mentioned above, the conventional substrate (well) voltage control circuit has such problems as a large chip area, a large power consumption in a standby state, and complex manufacturing processes. A circuit without these problems has been awaited.

Figure 14:
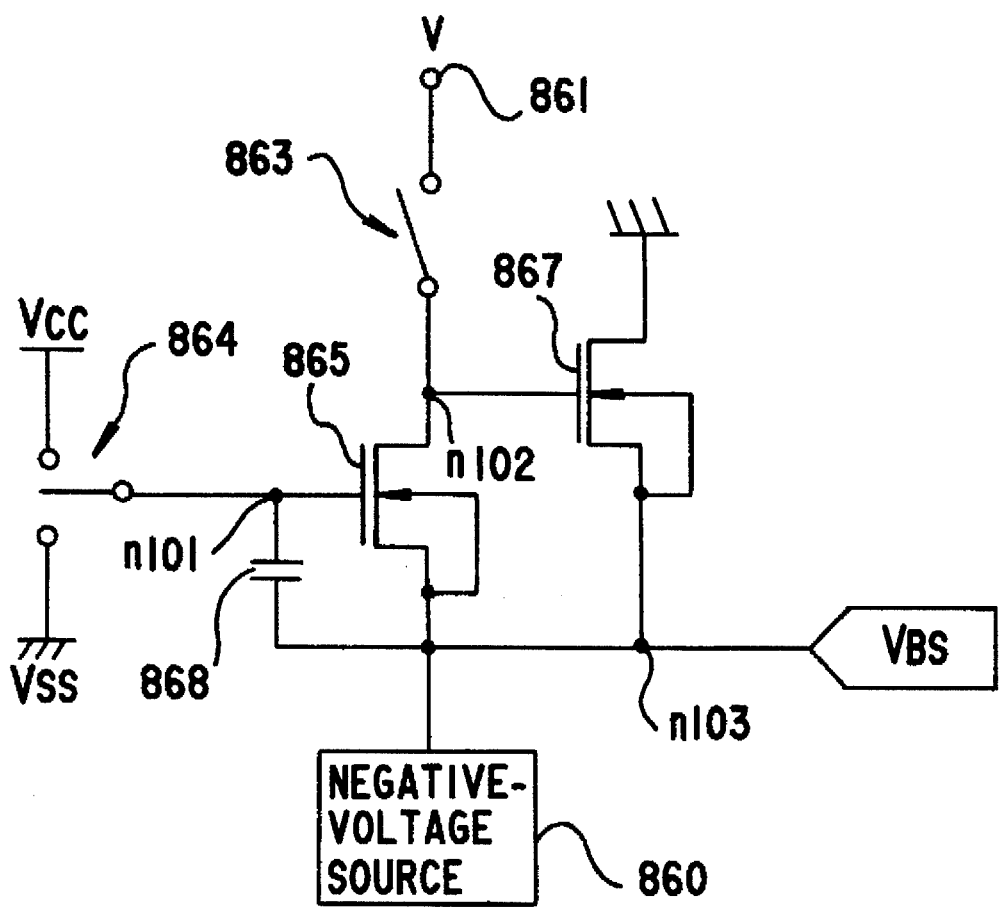
FIG. 14 is a configurational diagram showing the principle of a substrate (well) potential control circuit based on the present invention.

FIG. 14 is a configurational diagram for the principle of a substrate (well) voltage control circuit based on the present invention which solves the above problems.

As shown in FIG. 14, the substrate (well) voltage control circuit of the present invention comprises a negative voltage source 860 for outputting negative voltage to a power line $V_{BS}$ connected to a component whose voltage is to be controlled, a first n-channel transistor 867 whose substrate or well, and source are connected to the negative power line $V_{BS}$ and whose drain is connected to a power supply for outputting a zero voltage Vss, a second n-channel transistor 865 whose substrate or well and source are connected to the negative power line $V_{BS}$ and whose drain is connected to the gate of the first n-channel transistor 867, a first switch 863 placed between the gate of the first n-channel transistor 867 and a power supply for outputting a voltage V, a second switch 864 for selecting whether the gate of the second n-channel transistor 865 is connected to the power supply for outputting the positive voltage Vcc or the power supply for outputting the zero voltage Vss, or opened, and a capacitive element 868 connected between the gate and source of the second n-channel transistor 865. When negative voltage is not applied, the negative voltage source 860 is put into a non-output state, the first switch 863 is closed, and the second switch 864 is connected to the zero-voltage terminal. When negative voltage is applied, the first switch 863 is opened. The second switch 864 is connected to the positive-voltage terminal at the same time. Thereafter, the second switch 864 is opened, and the negative voltage source 860 is put into an output state.

TABLE 3

Truth table for the circuit in FIG. 14

| State of $V_{BS}$ Vss | 862 Vss | Switch 864 On | 861 Vcc | Switch 863 On | Node n101 Vss | Transistor 865 Off | Node n102 Vcc | Transistor 867 On | Negative-voltage generator Stopped |
|---|---|---|---|---|---|---|---|---|---|
| Ready for negative boosting | Vcc | On | — | Off | Vcc (=Vc) | On | Vss | Off | Still Stopped |
| Start of negative boosting | — | Off | — | Off | Vc | On | ↘ Off | | Operation start |
| Transition period | — | Off | — | Off | $V_{BB} + V_C$ | On | ↘ Off | | ↘ $V_{BB}$ |
| Negative boosting ($V_{BB}$) | — | Off | — | Off | $V_{BB} + V_C$ | On | $V_{BB}$ | Off | Operation |

Table 3 is a truth table for FIG. 14. Under the control shown in Table 3, the voltage at a point n101 at which negative voltage is applied is held at Vcc with respect to the substrate (well) of the transistor 865 owing to charges retained in the capacitive means C. The on state of the transistor 865 is maintained without a large potential difference. The switching transistor 867 is turned off. When the zero voltage Vss is applied, the transistor 865 is turned off, and the transistor 867 is turned on. The substrate (well) power line is then set to the zero voltage Vss.

The circuit in FIG. 14 can be composed of enhancement transistors alone, which therefore is small in scale and has no problem concerning resistivity.

Figure 15:
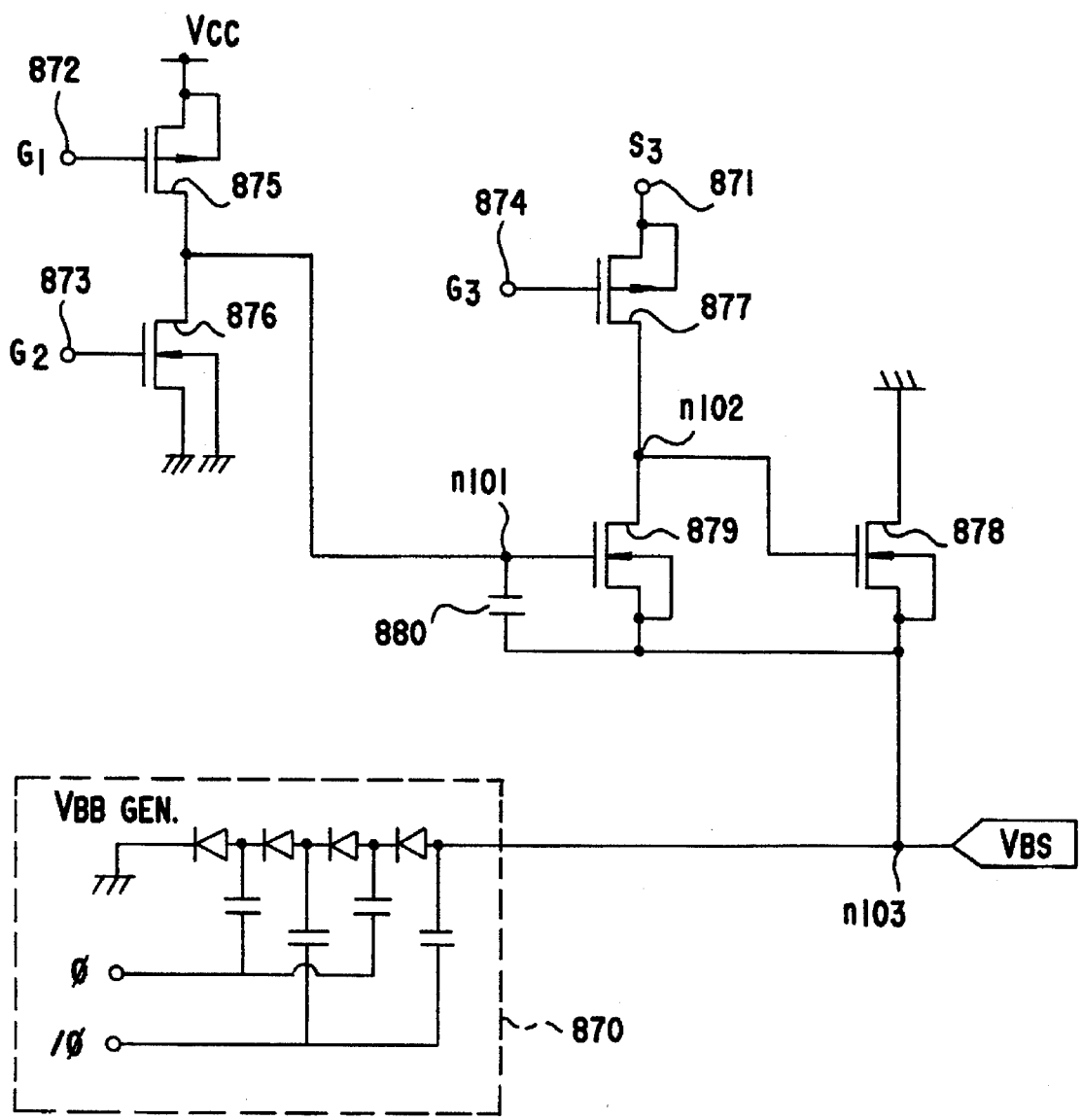
FIG. 15 shows a substrate (well) voltage control circuit in the first embodiment.
Figure 16:
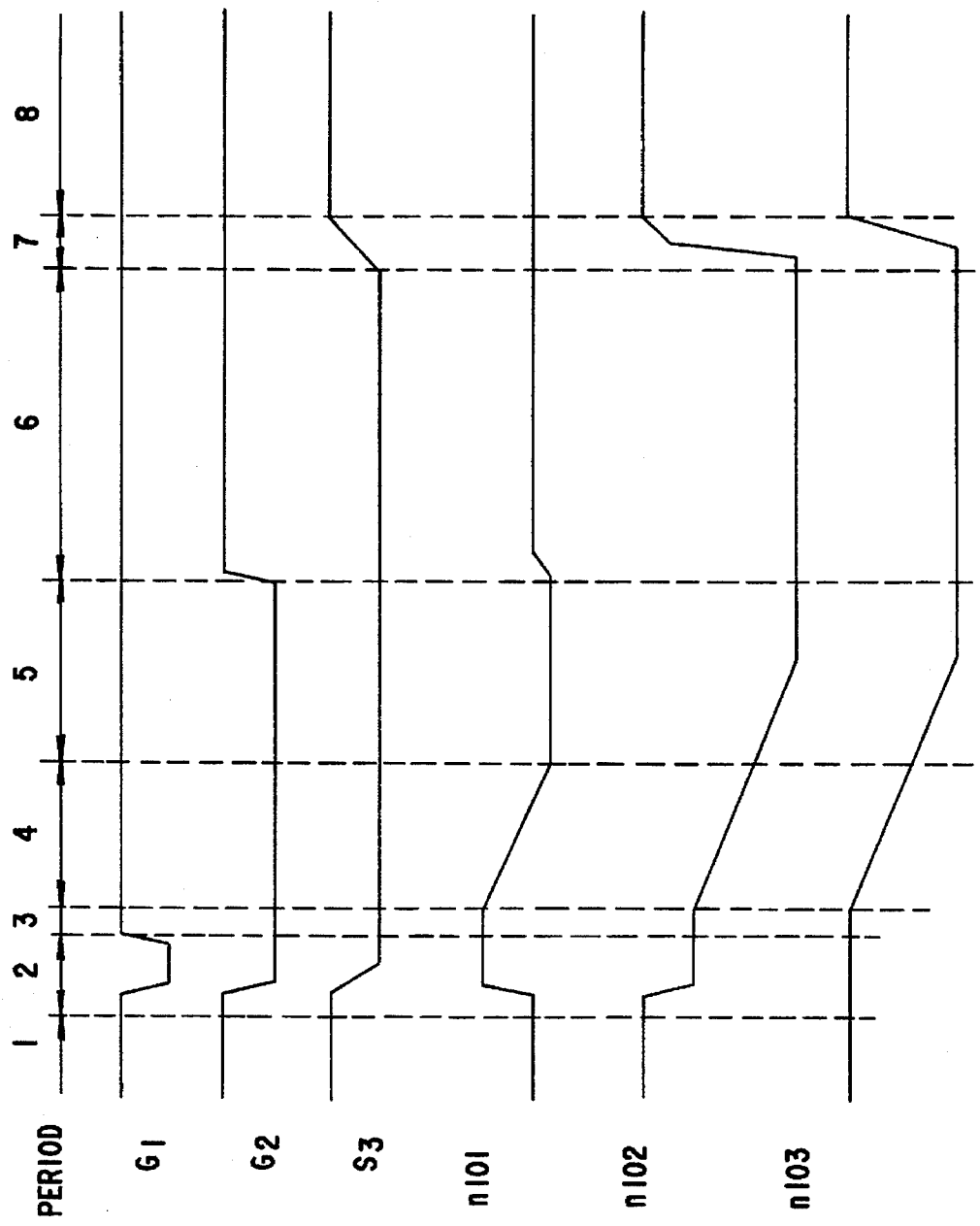
FIG. 16 is a timing chart showing the operations of the circuit in FIG. 15.

FIG. 15 shows a circuitry of the first embodiment embodied according to the configurational diagram showing the principle of the circuit in FIG. 14. FIG. 16 and Table 4 indicate the operations of the circuit. FIG. 16 shows voltage fluctuations at components, and Table 4 is a truth table. The step numbers of state transition in the truth table correspond to those on the temporal axis of the graph in FIG. 16.

TABLE 12

Truth table for the circuit in FIG. 15

| No. | State | G1 | G2 | G3 | Node n101 | Transistor 879 | Node n102 | Transistor 878 | $V_{BB}$ – gen. |
|---|---|---|---|---|---|---|---|---|---|
| 1 | $V_{BB}$ = Vcc | High | High | Low | To low | Off | To high | On | Stopped |
| 2 | Ready for negative boosting | Low | Low | High | To high | On | To low | Off | Still stopped |
| 3 | Start of negative boosting | High | — | — | C | — | $V_{BB}$ | — | Operation Started |
| 4 | Transition | — | — | — | $V_{BB}$ + Vcc | — | — | — | $V_{BB} > -V_{cc}$ |
| 5 | | — | — | — | – Vth (transistor 879) | — | — | — | $V_{BB} < -V_{cc}$ |
| 6 | Negative boosting | — | High | — | Vss | — | — | — | Operation |
| 7 | End of negative boosting | — | — | Low | Vss | on | To high | On | Operation stopped |
| 8 | $V_{BB}$ = Vss | High | High | — | To low | Off | To high | On | Stopped |

In the circuit of FIG. 15, a first switch 863 of FIG. 14 is realized by switching source voltages of a p-channel transistor 877. The circuit further includes a p-channel transistor 875 and an n-channel transistor 876 that are connected in series with each other between a positive power supply Vcc and a zero voltage source Vss and that are used to make or break a second switch 864 and to switch voltages for the terminal of the second switch 864. The gates of the transistors 875 and 876 serve as control terminals which are controlled with amplitude signals G1 and G2 that are a positive voltage Vcc and a zero voltage Vss. Reference number 870 denotes a negative voltage generator, which generates negative voltage with complementary clock signals received through terminals 0 and /0. A transistor 878 has a large driving capacity for driving a power line $V_{BS}$.

The operations of the circuit in FIG. 15 will be described in conjunction with FIG. 16 and Table 4. During the first period, the signals G1 and G2 are driven high. A signal G3 is set low and a signal S3 applied to a terminal 871 is set to Vcc, then, the negative voltage generator 870 stops its operation. When an application of negative voltage is started from this state, during the second period, the signals G1 and G2 are changed to low. A voltage signal S3 applied to a terminal 871 is then changed to Vss. The voltage at a node n101 is then driven high; that is, boosted to Vcc. A transistor 879 is turned on. The transistor 877 is turned off because the signal S3 is changed to Vss. The voltage at a node n102 is then driven low; that is, decreased to Vss. The transistor 878 is then turned off.

During the third period, the level of the signal G1 is changed to high. The negative voltage generator 870 then starts operating. The node n101 is then disconnected. The voltage of the power line $V_{BS}$ drops toward $V_{BB}$ during the fourth and fifth periods. The voltage at the node n101 also decreases because the node n101 is connected to the power line $V_{BS}$ via a capacitor 880. In the meantime, the transistor 879 is on, the voltage at a node n102 decreases, and the transistor 878 remains off.

The voltage at the node n101 remains higher by a voltage determined by charges retained in the capacitor 880 than that on the power line $V_{BS}$, and decreases with a voltage drop on the power line $V_{BS}$. However, when the voltage at the node n101 becomes slightly negative with respect to Vss and reaches the threshold voltage of the transistor 876, the voltage does not decrease any longer.

The sixth period correspond to a duration of generative voltage application, during which the signal G2 is driven high.

When negative voltage application terminates, the generative-voltage generator 870 stops operating. The voltage signal S3 applied to the terminal 871 is changed to Vcc. The transistor 877 is then turned on, and the voltage at the node n102 starts rising. Accordingly, the voltage on the power line $V_{BS}$ starts rising. At this time, the voltage at the node n101 is Vss. The transistor 879 is therefore off. When the voltage at the node n102 rises, the transistor 878 is turned on and the power line $V_{BS}$ is connected to the zero voltage source Vss.

Figure 17:
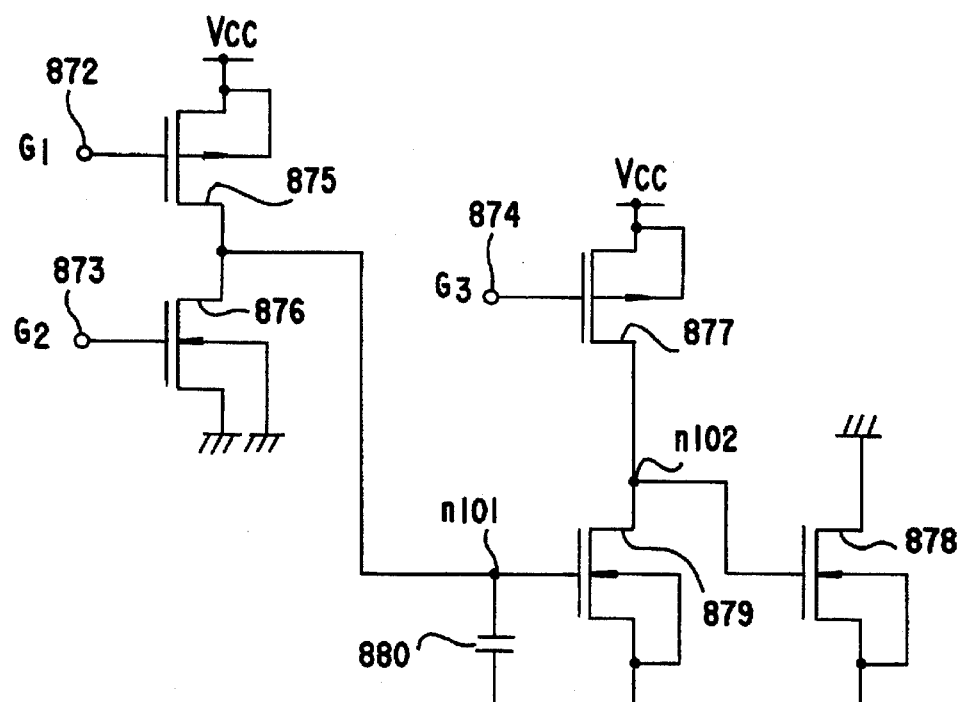
FIG. 17 shows a substrate (well) voltage control circuit in the second embodiment.
Figure 17:
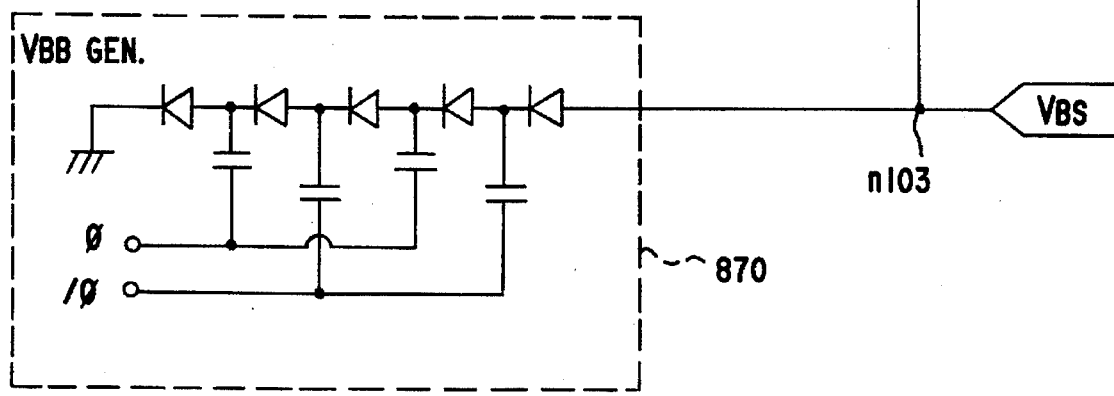

FIG. 17 shows a circuitry of a substrate (well) voltage control circuit of the second embodiment. The circuit of the second embodiment is identical to that shown in FIG. 15 except that the source of the transistor 877 is fixed to a power supply for outputting a positive voltage Vcc and the gate voltage of the transistor 877 is controlled. An operation different from that of the circuit in FIG. 15 is that the voltage applied to the source of the transistor 877 is not changed to Vss but the transistor 877 is turned off. Except for this point, the circuit in FIG. 17 operates identically to that in FIG. 15. Table 5 is a truth table for the operations of the circuit in FIG. 17.

TABLE 5

Truth table for the circuit in FIG. 17

| No. | State | G1 | G2 | G3 | Node n101 | Transistor 879 | Node n102 | Transistor 878 | $V_{BB}$ – gen. |
|---|---|---|---|---|---|---|---|---|---|
| 1 | $V_{BB}$ = Vcc | High | High | Low | To low | Off | To high | On | Stopped |
| 2 | Ready for negative boosting | Low | Low | High | To high | On | To low | Off | Still stopped |
| 3 | Start of negative boosting | High | — | — | C | — | $V_{BB}$ | — | Operation Started |

TABLE 5-continued

Truth table for the circuit in FIG. 17

| No. | State | G1 | G2 | G3 | Node n101 | Transistor 879 | Node n102 | Transistor 878 | $V_{BB}$ – gen. |
|---|---|---|---|---|---|---|---|---|---|
| 4 | Transition | — | — | — | $V_{BB}$ + Vcc | — | — | — | $V_{BB} > -V_{cc}$ |
| 5 | | — | — | — | – Vth (transistor 879) | — | — | — | $V_{BB} < -V_{cc}$ |
| 6 | Negative boosting | — | High | — | Vss | — | — | — | Operation |
| 7 | End of negative boosting | — | — | Low | Vss | on | To high | On | Operation stopped |
| 8 | $V_{BB}$ = Vss | High | High | — | To low | Off | To high | On | Stopped |

Figure 18:
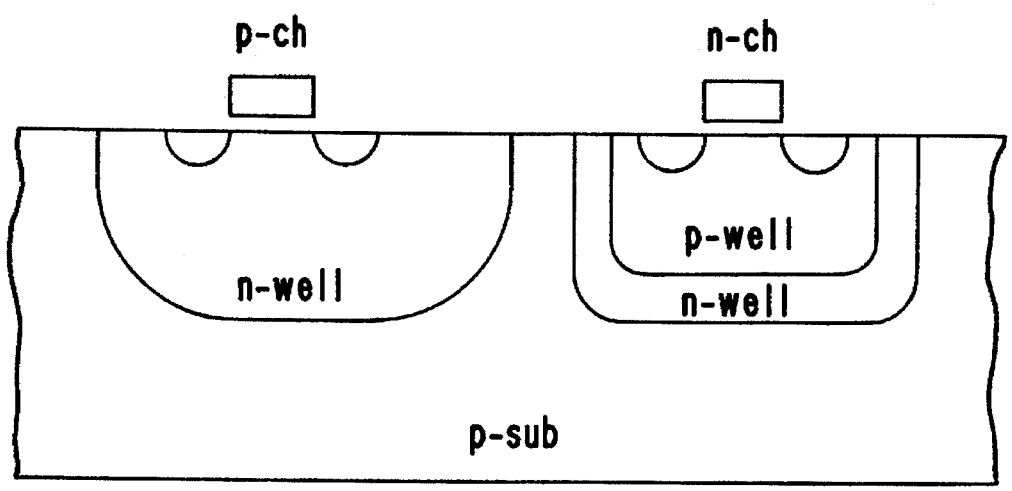
FIG. 18 shows an example of a conventional structure for forming a conventional substrate (well) voltage control circuit.
Figure 19:
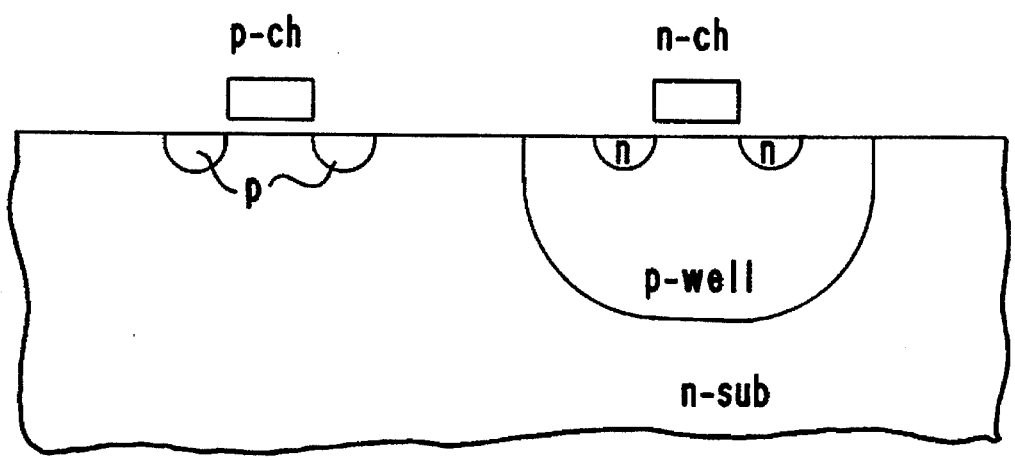
FIG. 19 shows an example of a structure of the substrate (well) voltage control circuit in FIG. 17.

For realizing the circuit in FIG. 17, a triple-well structure shown in FIG. 18 may be employed to prevent occurrence of forward bias current between a substrate or well and a diffused layer. For the circuit in FIG. 17, an n-substrate p-well structure shown in FIG. 19 can be employed.

In the aforesaid first and second embodiments, a capacitor is used as shown in the configuration diagram showing the principle of a circuit in FIG. 14 in order to prevent the gate-source voltage of the transistor 865 from exceeding a specified value (Vcc). This obviates the need of intensifying the gate-source resistivity. Even when the gate voltage is controlled without using a capacitor, the same advantage is available. An example is presented in the third embodiment.

Figure 20:
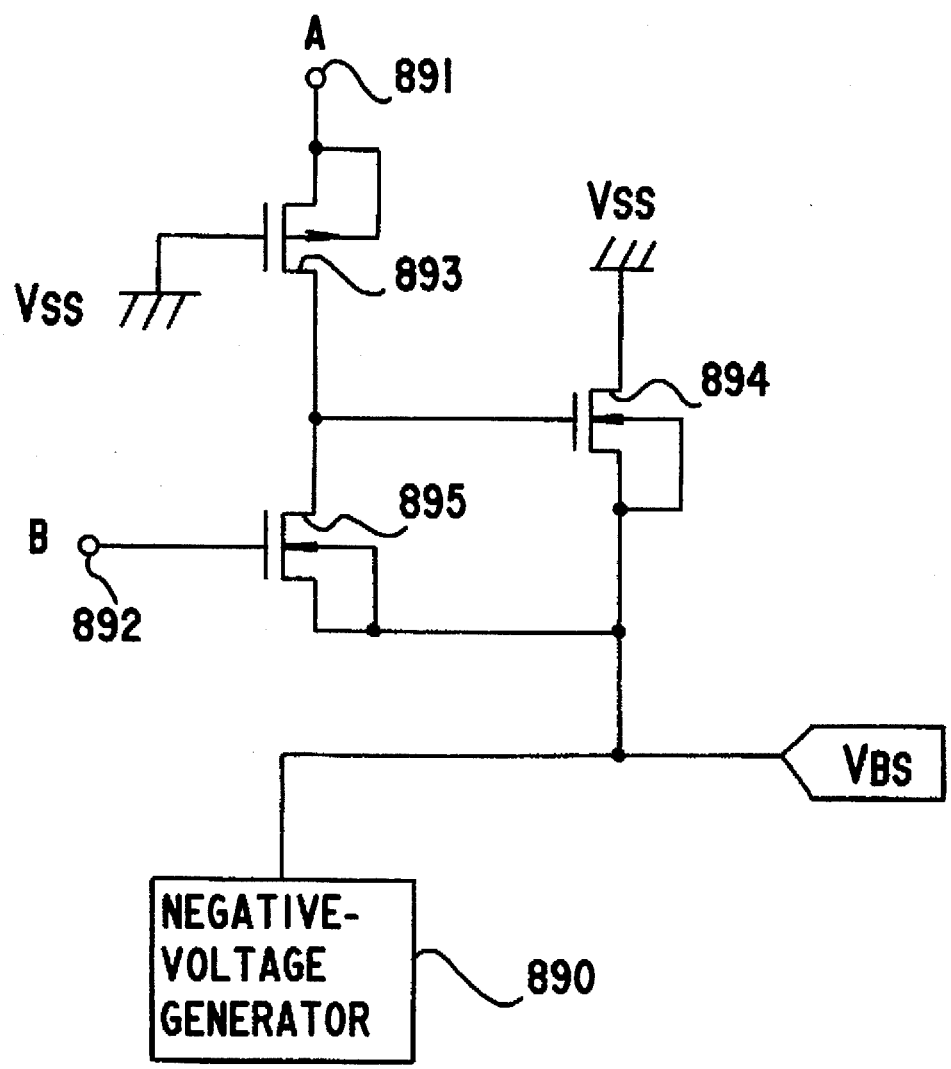
FIG. 20 shows a substrate (well) voltage control circuit in the third embodiment.
Figure 21:
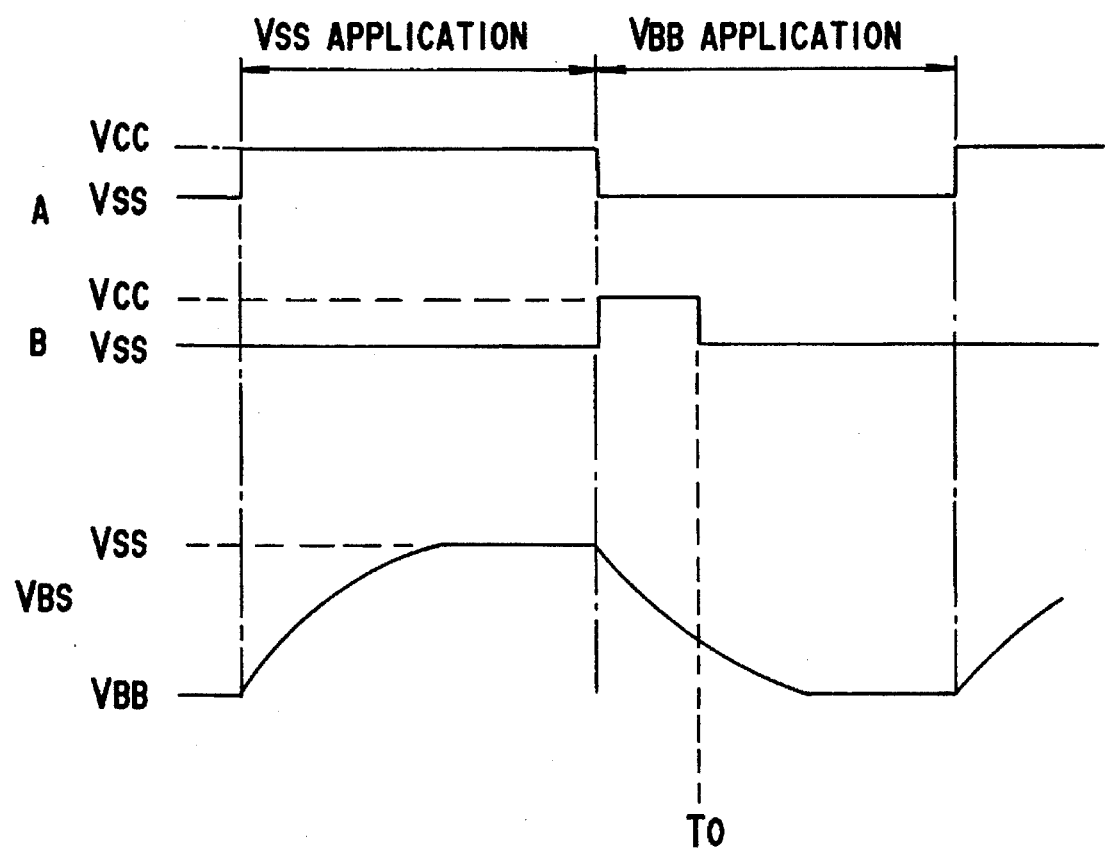
FIG. 21 is a timing chart showing the control and operations of the circuit in FIG. 20.

FIG. 20 shows a circuitry of a substrate (well) voltage control circuit of the third embodiment. FIG. 21 shows control signals supplied by the substrate (well) voltage control circuit and voltage fluctuations on a power line $V_{BS}$.

The circuit in FIG. 20 has substantially the same circuitry as the one in FIG. 14 except that the capacitative means 868 is excluded. Reference numerals 891 and 892 denote control terminals. Signals A and B whose logical levels are Vss and Vcc are applied to the control terminals 891 and 892. The operations of the circuit in FIG. 20 will be described in conjunction with the graph in FIG. 21.

As shown in FIG. 21, during Vss application, the signal A is set to Vcc and the signal B is set to Vss. The p-channel transistor 893 is turned on, and the n-channel transistor 895 is turned off. The gate voltage of the transistor 894 therefore becomes Vcc. The transistor 894 is turned on. Vss is then output to the power line $V_{BS}$.

During $V_{BB}$ application, the voltage of the signal A is switched to Vss and the voltage of the signal B is switched to Vcc. This causes the transistors 893 and 894 to turn off, and the transistor 895 to turn on. When the negative-voltage generator is actuated, the voltage on the power line $V_{BS}$ decreases gradually. When the voltage becomes lower than the threshold voltage of the transistor 895, the signal B is changed to Vss. The transistor 895 is still on. The voltage on the power line $V_{BS}$ decreases. Even when the voltage on the power line $V_{BS}$ decreases to be $V_{BB}$, the gate-source voltage of the transistor 895 is Vss–$V_{BB}$; that is, –$V_B$ which is much lower than that in prior arts.

As described above, the substrate (well) voltage control circuits in the first to third embodiments do not use any depletion-type transistors. Another manufacturing process is therefore unnecessary. An area occupied by n-channel transistors is smaller than the one occupied by depletion-type transistors. Furthermore, resistivity improves. Downsizing of devices and reduction in the number of processes realize upgrading of a yield, improvement of reliability, and cutting of costs.

We claim:

1. A substrate voltage control circuit, comprising:
   a negative-voltage source for outputting negative voltage to a power line;
   a first n-channel transistor whose substrate or well and source are connected to said power line and whose drain is connected to a ground power supply;
   a second n-channel transistor whose substrate or well and source are connected to said power line and whose drain is connected to a gate of said first n-channel transistor;
   a first switch placed between the gate of said first n-channel transistor and a positive power supply;
   a second switch for use in selecting whether a gate of said second n-channel transistor is connected to said positive power supply or ground power supply, or opened; and
   a capacitive element connected between the gate and source of said second n-channel transistor;
   when negative voltage is not applied, said negative-voltage source having a non-output state, said first switch being connected to said positive power supply, and said second switch being connected to said ground power supply; and
   when negative voltage is applied, said first switch being opened, said second switch being connected to said positive power supply, and then said second switch being opened, and said negative-voltage source having an output state.

2. A substrate voltage control circuit according to claim 1, wherein said second switch consists of a p-channel transistor and an n-channel transistor which are connected in series with each other between said positive power supply and ground power supply; and said second switch changes states of connection between said positive power supply and said ground power supply depending on signals applied to the gates of the p-channel transistor and n-channel transistor.

3. A substrate voltage control circuit according to claim 1, wherein said first switch is a p-channel transistor.

4. A substrate voltage control circuit, comprising:
   a negative-voltage source for outputting negative voltage to a power line connected to a substrate or well;
   a first n-channel transistor whose substrate or well and source are connected to said power line and whose drain is connected to a ground power supply;
   a second n-channel transistor whose substrate or well and source are connected to said power line and whose drain is connected to a gate of said first n-channel transistor;

a first gate voltage source for selectively applying the voltages of a positive power supply and a ground power supply to the gate of said first n-channel transistor;

a second switch for use in selecting whether a gate of said second n-channel transistor is connected to said positive power supply or ground power supply, or opened; and a capacitive element connected between the gate and source of said second n-channel transistor;

when negative voltage is not applied, said negative voltage source having a non-output state, said first gate voltage source outputting the voltage of said positive power supply, and said second switch being connected to said ground power supply; and when negative voltage is applied, said first gate voltage source being changed to output the voltage of said ground power supply, said second switch being connected to said positive power supply, and then said second switch being opened and said negative-voltage source having an output state.

5. A substrate voltage control circuit according to any of claims 1 to 4, wherein said first and second n-channel transistors are formed in a p-well region on an n-type substrate.

6. A substrate voltage control circuit claimed in any of claim 1 to 4 wherein said substrate voltage control circuit is included in a flash memory.

* * * * *